(12) United States Patent
Meyer et al.

(10) Patent No.: US 6,543,098 B2
(45) Date of Patent: Apr. 8, 2003

(54) PRINTED CIRCUIT BOARD MOUNTING FACILITY

(75) Inventors: Daniel B. Meyer, Lake Oswego, OR (US); Kevin Taylor, Beaverton, OR (US); Mike A. Vilhauer, Hillsboro, OR (US); J. Steve Lyford, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/798,476

(22) Filed: Mar. 2, 2001

(65) Prior Publication Data

US 2002/0121008 A1 Sep. 5, 2002

(51) Int. Cl.[7] ................................................ A44B 21/00
(52) U.S. Cl. ........................................ 24/289; 24/543
(58) Field of Search ............................... 411/383, 384, 411/400, 546, 174, 175; 269/47, 49–52; 439/551, 564, 573; 24/289, 290, 453; 403/408.1; 174/138 D, 138 G

(56) References Cited

U.S. PATENT DOCUMENTS

| | | | | |
|---|---|---|---|---|
| 3,747,168 A | * | 7/1973 | Snarskis | 411/349 |
| 3,927,707 A | * | 12/1975 | Wright | 411/174 |
| 3,956,803 A | * | 5/1976 | Leitner | 411/349 |
| 4,200,900 A | * | 4/1980 | McGeorge | 174/138 D |
| 4,363,530 A | * | 12/1982 | Verhoeven | 439/557 |
| 4,372,015 A | * | 2/1983 | Rhoton | 24/453 |
| 4,473,204 A | * | 9/1984 | Bohm | 174/138 D |
| 5,460,543 A | * | 10/1995 | Kosmala | 439/567 |
| 5,754,412 A | * | 5/1998 | Clavin | 174/138 D |
| 5,956,835 A | * | 9/1999 | Aksu | |
| 6,081,974 A | * | 7/2000 | McDaid | 24/265 CD |
| 6,124,552 A | * | 9/2000 | Boe | 174/135 |
| 6,317,936 B1 | * | 11/2001 | McDaid et al. | 24/265 CD |

* cited by examiner

Primary Examiner—James R. Brittain
(74) Attorney, Agent, or Firm—Bennet K. Langlotz; Thomas F. Lenihan

(57) ABSTRACT

A facility for mounting an electronic component includes a first circuit board having of mounting apertures. A mounting element is associate with each aperture, and includes a boss defining a bore. The boss has a first surface contacting a major surface of the first circuit board, and a second surface opposite the first surface. A pin is received in the bore, and has a lower portion protruding from the first surface of the boss and into one of the apertures. The pins lower portion definves a spece to capture a portion of the first circuit board. A fastener connected to the pin may generate compression between the spece and the boss to secure the board, and a corner-shaped protrusion on the second surface may constrain the corner periphery of a second board resting on the second surface, with the fastener also securing the second board against the boss.

16 Claims, 2 Drawing Sheets

PRINTED CIRCUIT BOARD MOUNTING FACILITY

FIELD OF THE INVENTION

The invention relates to mechanical fasteners, particularly for mounting electronic components to printed circuit boards.

BACKGROUND AND SUMMARY OF THE INVENTION

It is often necessary to mechanically mount components to a printed circuit board. For example, a second, smaller "daughter" board may be mounted to a larger "mother" board, parallel to and adjacent to the board. Similarly, components such as integrated circuit chips, and connectors having planar portions to be connected to a mother board are connected with a main portion in parallel with the board. Such components may have an array of pins that extend to electrical contact with a receptacle on the board, providing electrical connection.

Attached components often must be mechanically secured to the mother board. In many instances, conventional fasteners may be used, such as by passing a screw through holes in each board. However, many such fasteners require access to the opposite side of the mother board for installation. Other fasteners, such as those using a snap mechanism that connects to the mother board permit such "blind" attachment (when the opposite side is inaccessible,) but do not permit repeated extraction and firm reconnection, as is often required for testing, and for service of certain components.

Conventional fasteners may also be difficult to use. Even where fasteners are provided readily on a mother board to accept a daughter board, these are often difficult to align with holes on the daughter board, because the daughter board obscures the fasteners as installation is attempted. This risks misalignment, damage to mating connector pins, and unwanted contact of components on either board as alignment is being sought.

The embodiments disclosed herein overcome these limitations by providing a facility for mounting an electronic component includes a first circuit board having of mounting apertures. A mounting element is associated with each aperture, and includes a boss defining a bore. The boss has a first surface contacting a major surface of the first circuit board, and a second surface opposite the first surface. A pin is received in the bore, and has a lower portion protruding from the first surface of the boss and into one of the apertures. The pin's lower portion defines a space to capture a portion of the first circuit board. A fastener connected to the pin may generate compression between the space and the boss to secure the board, and a corner-shaped protrusion on the second surface may constrain the corner periphery of a second board resting on the second surface, with the fastener also securing the second board against the boss.

DETAILED DESCRIPTION OF A PREFERRED EMBODIMENT

Figure 1:
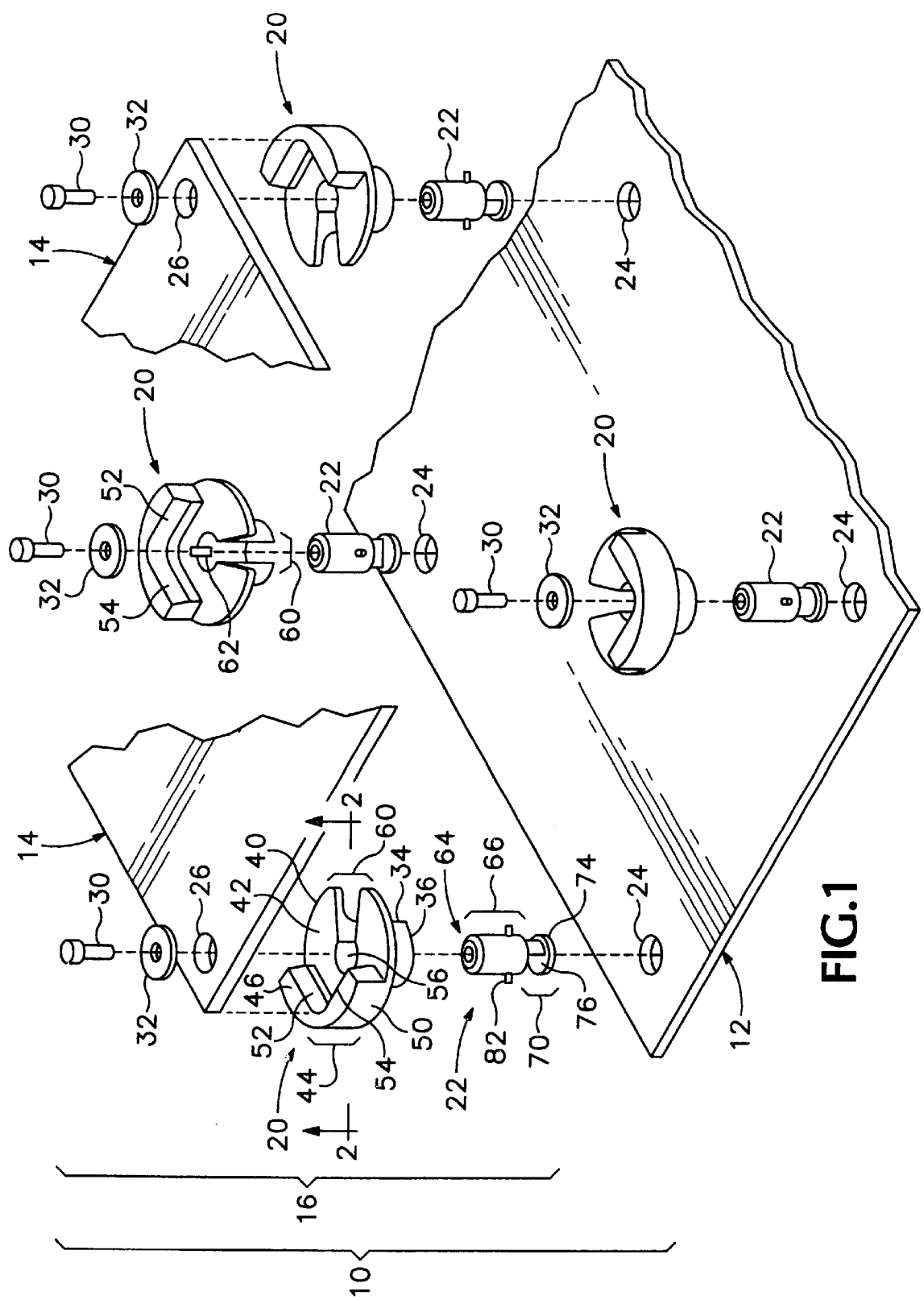
FIG. 1 is an exploded view of a facility according to a preferred embodiment of the invention.

FIG. 1 shows a circuit assembly 10. The assembly includes a mother board 12, a daughter board 14, and a set of mechanical connector assemblies 16, each at a corner of the daughter board. The mother board is a printed circuit board such as used as the primary circuit board in a personal computer, although any rigid plate, sheet, or board may be used with the fasteners discussed below. The daughter board is shown as a simple circuit board, and is typically smaller than the mother board, with several such boards being attached to a single mother board in the manner discussed below. The daughter board need not be a permanently mounted component; the connection facility is well suited for temporary connection of a daughter board than functions as a connector, such as via cabling to test instrumentation designed to test the mother board. In the preferred embodiment, electrical connection between the daughter board and mother board is provided by a mounted electronic connector (not shown) on the daughter board that mates with a corresponding connector (not shown) on the mother board.

Each connector assembly includes a plastic standoff or boss 20 that is largely positioned between the boards. A registration pin 22 extends through the boss and through apertures 24, 26 on the respective boards. A screw 30 connects to the pin, and a washer 32 surrounds the screw. The boss 20 has a lower cylindrical body portion 34 having a lower surface 36 that contacts the upper surface of the mother board 12. A flange 40 protrudes peripherally from the upper end of the body, and defines an upwardly facing upper surface 42 upon which the daughter board 14 rests. An angled wall 44 protrudes upwardly from the periphery of the upper surface. The wall has two wall portions 46, 50 at right angles to each other, and extends about slightly less than half the circumference of the flange. The wall portions have medially-facing surfaces 52, 54 that define a right angled corner space that receive the corner of the daughter board, so that the edges of the board abut the wall surfaces. The wall surfaces are tapered so that the daughter board is readily guided into position, with a relatively closer peripheral fit when it rests on the flange surface 42.

The boss defines a cylindrical bore 56 extending perpendicularly through each of the surfaces 36, 42, concentric with the body 34. A gap 60 extends from the bore to the periphery of the body and flange, toward the edge opposite the vertex of the walls 46, 50.

The gap allows slight flexure, so that the bore may snugly and slidably accommodate the pin. The bore defines an axial pin alignment groove 62 (best seen in the element 20 in the upper center of FIG. 1) defined in the surface of the bore, and which extends from the upper surface 42, toward but not fully reaching the lower surface 36. The groove is opposite the gap, and is positioned near the corner of the walls 46, 50.

The pin 22 is a solid steel pin having a chamfered first end 64 in which an axial threaded bore is defined to receive the shank of screw 30. The pin has a major first section 66 that is cylindrical, with the full diameter sized to be snugly fit in the bore 56. Below the first section is a second section 70 with a reduced diameter, and with a semicircular cross section having a curved surface concentric with the pin axis, and a straight surface aligned with the pin axis. The absent material at the semicircular section defines a space 72 in which a portion of the mother board at the aperture 24 may be received. A third section 74 of the pin provides the lower end of the pin, and is a flange of a diameter equal to that of the first section, and which defines a ledge surface 76 at the space 72.

The pin defines a small lateral bore 80 that perpendicularly intersects the pin axis through the first section of the pin, below the end of the threaded bore, and above the second section. The bore is oriented perpendicularly with respect to the plane of the semicircular section, so that one end of the bore extends in the same direction as the ledge 76. A registration pin 82 resides in the bore 80, and has a protruding portion that resides in the alignment groove 62, so that the pin is rotationally linked to the boss, and the pin is limited in its downward travel and does not escape the lower aperture of the bore. The pin is oriented so that the ledge 76 extends in the same direction as the vertex of the walls 46, 50.

Figure 2:
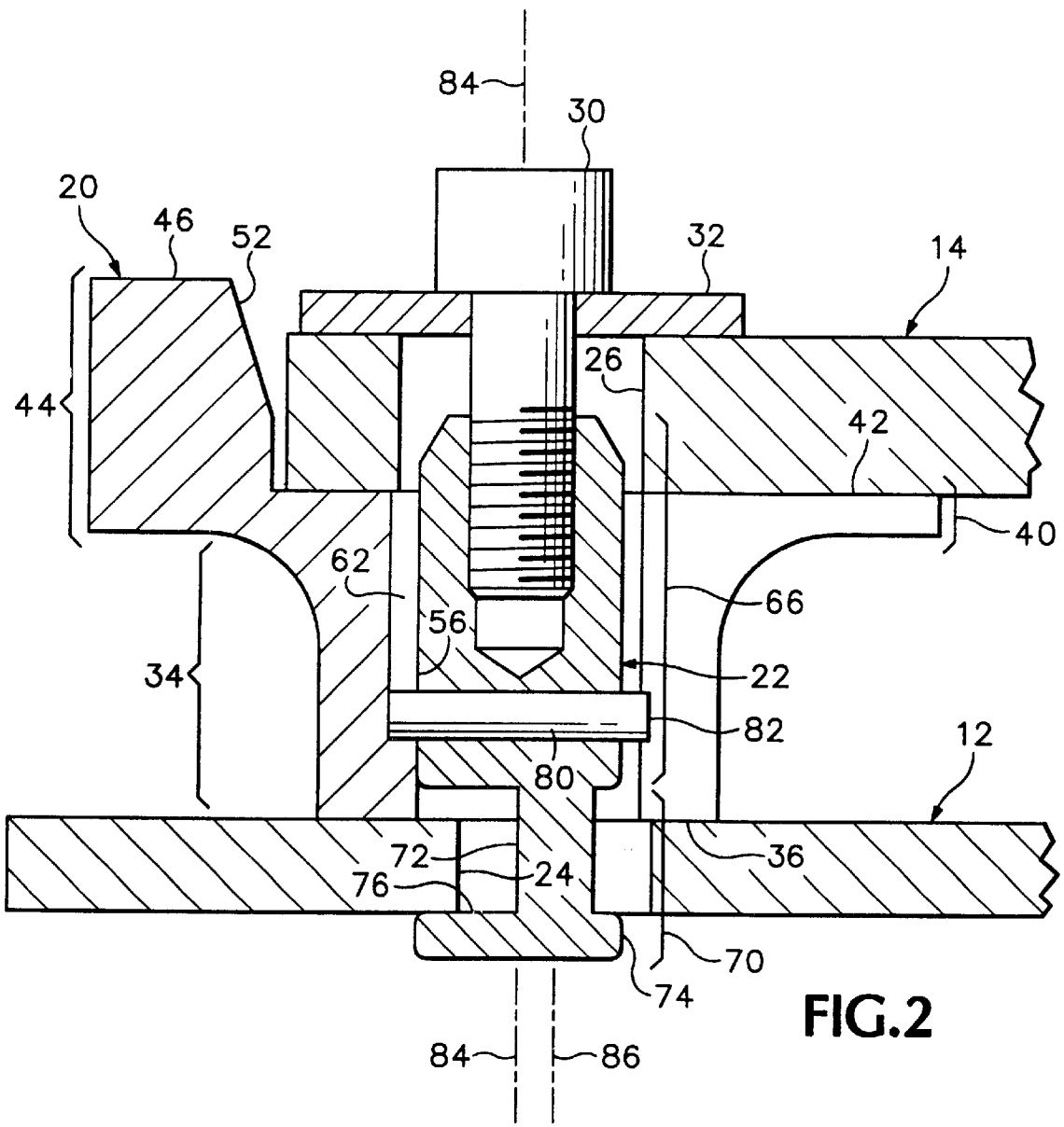
FIG. 2 is an enlarged sectional view of the facility of FIG. 1.

FIG. 2 shows the facility in a secure, attached position. To achieve this condition, the pin is inserted in the boss, with the second and third sections 70, 74 protruding from the lower surface of the boss, and the registration pin 82 positioned at the lower limit of the groove 62. The boss is positioned on the motherboard, with the lower third section fully inserted through the aperture 24 with the ledge surface 76 below the lower surface of the mother board. The boss is rotationally oriented so that the vertex of walls 46, 50 points away from the diagonally opposed boss, and so that wall surface 52 of each boss defines a common plane with the wall surface 54 of the neighboring boss. Thus, the wall surfaces 52, 54 define the corners of a rectangle sized to accept the daughter board, and each ledge 76 extends laterally away from the center of the daughter board.

Thus oriented, the bosses are each shifted radially away from the daughter board center, so that the edges of the flat surface of the second section of the pin 22 abuts the edge of the aperture 24. By this, the axis 84 of the pin is offset from the axis 86 of the motherboard aperture 24.

When the bosses are positioned in the offset position, the ledges prevent their axial extraction from the apertures. The daughter board is then positioned with its corners guided by the corner walls of each boss, and lowered onto the upper boss surfaces 42, so that the pin is closely and coaxially received by the aperture 26. Accordingly, the apertures of the mother board are offset from those of the daughter board. The chamfer of the pin aids the guiding into position, as does the taper of the walls 46, 50. In addition, the pin alignment is readily located because the walls 46, 50 extend beyond the corners of the daughter board, and are thus simultaneously visible from above to the assembler (either human or automated machine vision). This alignment guide provided while the daughter board is well above the attached position helps to prevent damage to delicate components mounted on either board, including pins for connection to a socket on the mother board.

With the board positioned on the bosses (and a connection being made between the boards with a connector—not shown), the screw 30 (with washer 32) is threaded into the pin bore, and tightened. This drives the screw head and washer surface downward until contact is made with the upper surface of the daughter board. As driving of the screw proceeds, the pin is drawn axially upward, until the ledge 76 contacts the lower surface of the mother board. The torque applied to the screw determines the force of the ledge against the board, and is selected to prevent the pin and boss from being laterally displaced.

The daughter board 14 is removable simply by removing the screws, and withdrawing the board. The connector bosses may also be readily removed by shifting them to bring the pin axes in line with the aperture centers, and withdrawing them. Neither the installation not removal of the daughter board or boss assemblies requires visual or physical access to the lower side of the mother board.

While the above is discussed in terms of preferred and alternative embodiments, the claims are not intended to be so limited.

What is claimed is:

1. A facility for mounting an electronic component, comprising:
    a first circuit board defining a plurality of mounting apertures, each of said mounting apertures being surrounded by circuit board material;
    a mounting element associated with each aperture;
    the mounting element including a boss defining a bore;
    the boss having a first surface contacting a major surface of the first circuit board;
    the boss having a second surface facing opposite the first surface;
    a pin received in the bore;
    the pin having a lower portion protruding from the first surface of the boss and into one of the apertures; and
    the pin lower portion defining a space operable to capture a portion of the first circuit board; and wherein
    the pin is engaged to the boss, such that when said pin and said boss rotate, said pin and said boss rotate in unison.

2. A facility for mounting an electronic component, comprising:
    a first circuit board defining a plurality of mounting apertures;
    a mounting element associated with each aperture;
    the mounting element including a boss defining a bore;
    the boss having a first surface contacting a major surface of the first circuit board;
    the boss having a second surface facing opposite the first surface;
    a pin received in the bore;
    the pin having a lower portion protruding from the first surface of the boss and into one of the apertures; and
    the pin lower portion defining a space operable to capture a portion of the first circuit board; and wherein
    the boss includes a protruding element from the second surface, and wherein the protruding element is eccentric with respect to the pin.

3. The facility of claim 2 wherein the protruding element is positioned at a limited portion of the periphery of the second surface.

4. The facility of claim 2 wherein the protruding element defines a corner space.

5. The facility of claim 4 wherein the board defines four apertures in a rectangular arrangement, and wherein a mounting element is oriented in each aperture with the corners arranged to closely receive a rectangular second circuit board.

6. The facility of claim 5 including a second circuit board defining a set of apertures, each associated with the apertures of the first board, and each offset from axial alignment with respect to the corresponding aperture.

7. The facility of claim 2 wherein the pin is axially slidable within the bore.

8. A facility for mounting an electronic component, comprising:
    a first circuit board defining a plurality of mounting apertures, each of said mounting apertures being surrounded by circuit board material;
    a mounting element associated with each aperture;
    the mounting element including a boss defining a bore;
    the boss having a first surface contacting a major surface of the first circuit board;
    the boss having a second surface facing opposite the first surface;

a pin received in the bore;

the pin having a lower portion protruding from the first surface of the boss and into one of the apertures; and the pin lower portion defining a space operable to capture a portion of the first circuit board; wherein the pin has an upper end protruding above the second surface; and wherein the upper end of the pin is chamfered.

9. The facility of claim 2 including a fastener connected to the pin and operable to generate compression between a ledge surface portion of the pin associated with the space and the first surface of the boss, such that a portion of the board is secured therebetween.

10. A fastener assembly for connecting two circuit boards comprising:

a boss having opposed parallel first and second surfaces;

the boss defining a bore extending to an opening at each of the first and second surfaces;

a pin received in the bore and having a first end extending from the first surface and a second end extending from the second surface;

the second end of the pin defining a space operable to capture a portion of the first circuit board; and wherein the pin is engaged to the boss, such that when said pin and said boss rotate, said pin and said boss rotate in unison; and wherein the boss includes a protruding element from the second surface, and wherein the protruding element is eccentric with respect to the pin, such that a visual indication of rotational orientation is provided.

11. The faster assemble of claim 10, wherein the protruding element is positioned at a limited portion of the periphery of the second surface.

12. The faster assembly of claim 10 wherein the protruding element defines a corner space.

13. The fastener assembly of claim 10 wherein the pin is axially slidable within the bore.

14. The fastener assembly of claim 10 wherein the pin has an upper end protruding above the second surface.

15. The fastener assembly of claim 10 including a fastener connected to the pin and operable to generate compression between a ledge surface portion of the pin associated with the space and the first surface of the boss.

16. The fastener assembly of claim 10 wherein the boss is split, such that the bore receives the pin with a spring fit.

* * * * *